United States Patent
Lee (10) Patent No.: US 7,812,656 B2
(45) Date of Patent: Oct. 12, 2010

(54) DATA DRIVER CIRCUIT AND DELAY-LOCKED LOOP

(75) Inventor: Yong-Jae Lee, Yongin-si (KR)

(73) Assignee: AnaPass Inc., Seoul (KR)

( * ) Notice: Subject to any disclaimer, the term of this patent is extended or adjusted under 35 U.S.C. 154(b) by 0 days.

(21) Appl. No.: 12/234,505

(22) Filed: Sep. 19, 2008

(65) Prior Publication Data

US 2009/0079477 A1    Mar. 26, 2009

(30) Foreign Application Priority Data

Sep. 20, 2007    (KR) .................. 10-2007-0095802

(51) Int. Cl.
*H03L 7/06* (2006.01)
(52) U.S. Cl. .................... 327/158; 327/149
(58) Field of Classification Search ............. 327/158, 327/149
See application file for complete search history.

(56) References Cited

U.S. PATENT DOCUMENTS

| | | | |
|---|---|---|---|
| 5,663,665 A * | 9/1997 | Wang et al. ............ | 327/3 |
| 6,304,116 B1 * | 10/2001 | Yoon et al. ............ | 327/158 |
| 7,073,098 B2 * | 7/2006 | Kozaki ............ | 714/700 |
| 7,602,223 B2 * | 10/2009 | Baek et al. ............ | 327/158 |
| 2008/0252340 A1 * | 10/2008 | Yeo et al. ............ | 327/156 |
| 2009/0079719 A1 * | 3/2009 | Lee ............ | 345/204 |
| 2009/0243679 A1 * | 10/2009 | Smith et al. ............ | 327/158 |
| 2009/0262876 A1 * | 10/2009 | Arima et al. ............ | 375/374 |

* cited by examiner

*Primary Examiner*—Lincoln Donovan
*Assistant Examiner*—Adam D Houston
(74) *Attorney, Agent, or Firm*—Sherr & Vaughn, PLLC

(57) ABSTRACT

A data driver circuit and a delay-locked loop (DLL) are provided. The data driver circuit and DLL can operate normally in spite of errors, etc., caused when an analog data signal is applied to a display panel. The DLL, which receives a first clock signal and outputs a second clock signal, includes a phase detector for outputting a phase difference signal according to the first clock signal, the second clock signal and at least one delay signal, and a delay line for generating the second clock signal and the delay signal by delaying the first clock signal. Here, the phase difference signal has a value corresponding to a phase difference between the first clock signal and the second clock signal, according to the first clock signal or the second clock signal, and a value corresponding to a case in which there is no phase difference according to the delay signal, and a first delay that is a delay of the second clock signal with respect to the first clock signal changes according to the phase difference signal.

14 Claims, 6 Drawing Sheets

DATA DRIVER CIRCUIT AND DELAY-LOCKED LOOP

CROSS REFERENCE TO RELATED APPLICATIONS

This application claims priority from Korean Patent Application No. 10-2007-0095802, filed on Sep. 20, 2007, the disclosure of which is incorporated herein in its entirety by reference.

BACKGROUND OF THE INVENTION

1. Field of the Invention

The present invention relates to a data driver circuit and a delay-locked loop (DLL), and more particularly, to a data driver circuit and a DLL capable of operating normally in spite of an error, etc., caused when an analog data signal is applied to a display panel.

2. Discussion of Related Art

A data driver circuit functions to apply an analog data signal corresponding to a data signal transmitted from a timing controller to a display panel. The data driver circuit receives a clock signal (also referred to as a horizontal synchronization signal) synchronized with the data signal together with the data signal from the timing controller, and may include a DLL to restore the original clock signal from the received clock signal. When the analog data signal output from the data driver circuit to the display panel changes, a large current momentarily flows from the data driver circuit to the display panel and causes noise in the data driver circuit (for example, the current momentarily changes a power supply voltage and/or ground voltage of the data driver circuit). Due to the noise, one or more clocks of a received clock signal input to the DLL may be lost, unlocking the DLL. Once the DLL is unlocked, a considerable amount of time is required to relock it. Due to this unlocking of the DLL, errors in a received clock signal occurring within in a short time period can have long-lasting repercussions.

SUMMARY OF THE INVENTION

The present invention provides a data driver circuit capable of keeping a delay-locked loop (DLL) locked even if some clocks of a received clock signal are lost due to a change of an analog data signal applied from the data driver circuit to a display panel, and a DLL that can be used in the data driver circuit.

According to an example embodiment of the present invention, a DLL that receives a first clock signal and outputs a second clock signal includes: a phase detector for outputting a phase difference signal according to the first clock signal, the second clock signal and at least one delay signal, wherein the phase difference signal has a value corresponding to a phase difference between the first clock signal and the second clock signal according to the first clock signal or the second clock signal, and a value corresponding to a case in which there is no phase difference according to the at least one delay signal; and a delay line for delaying the first clock signal and outputting the second clock signal and the at least one delay signal, wherein a first delay that is a delay of the second clock signal with respect to the first clock signal changes according to the phase difference signal.

According to another example embodiment of the present invention, a method of controlling a first delay that is a delay between a first clock signal and a second clock signal obtained by delaying the first clock signal includes: (a) providing a phase difference signal corresponding to a phase difference between the first clock signal and the second clock signal according to the first clock signal or the second clock signal; (b) providing the phase difference signal corresponding to a case in which there is no phase difference according to a first delay signal obtained by delaying the first clock signal; and (c) adjusting the first delay according to the phase difference signal.

According to still another example embodiment of the present invention, a data driver circuit that receives a first data signal and a first clock signal and outputs a second data signal to be transmitted to a display panel includes: a data driver for sampling the first data signal in response to a second clock signal, obtaining the second data signal by analog-converting the first data signal, and outputting the second data signal; and a DLL for generating the second clock signal from the first clock signal, wherein there is a delay between the first clock signal and the second clock signal that changes according to a phase difference signal corresponding to a phase difference between the first clock signal and the second clock signal, and a period in which the phase difference signal has a value corresponding to a case in which there is a phase difference is limited.

BRIEF DESCRIPTION OF THE DRAWINGS

The above and other objects, features and advantages of the present invention will become more apparent to those of ordinary skill in the art by describing in detail example embodiments thereof with reference to the attached drawings, in which.

DETAILED DESCRIPTION OF EXAMPLE EMBODIMENTS

Hereinafter, example embodiments of the present invention will be described in detail. However, the present invention is not limited to the embodiments disclosed below but can be implemented in various modified forms. The following embodiments are described in order to fully enable those of ordinary skill in the art to embody and practice the present invention.

Figure 1:
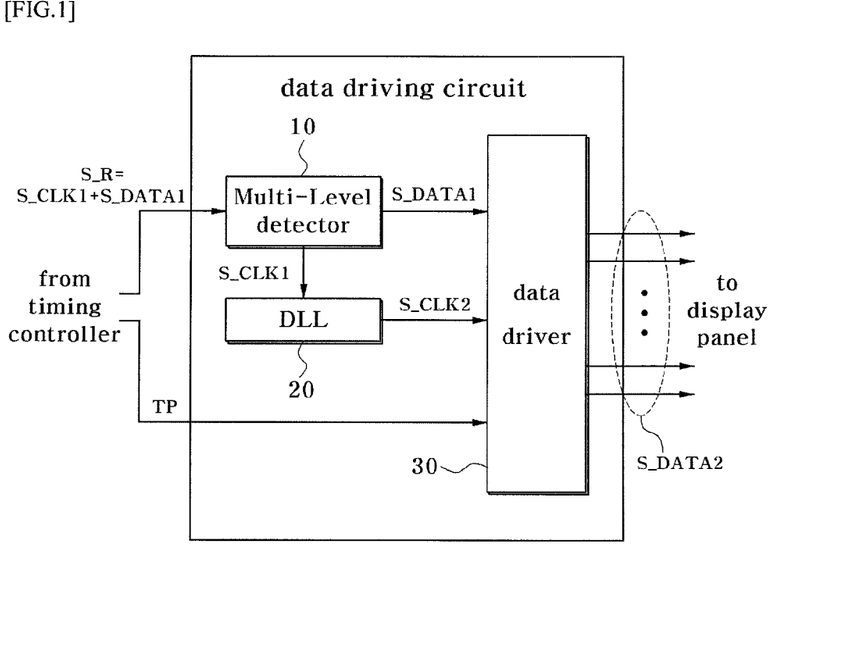
FIG. 1 is a block diagram of a data driver circuit according to a first example embodiment of the present invention, illustrating a case in which a first clock signal is embedded in a first data signal with a different signal magnitude.

FIG. 1 is a block diagram of a data driver circuit according to a first example embodiment of the present invention, illustrating a case in which a first clock signal is embedded in a first data signal with a different signal magnitude.

Referring to FIG. 1, the data driver circuit includes a multi-level detector 10, a delay-locked loop (DLL) 20 and a data driver 30.

The multi-level detector 10 functions to extract a first clock signal S_CLK1 from a received signal S_R. The multi-level detector 10 may also extract a first data signal S_DATA1 from the received signal S_R. The received signal S_R includes the first clock signal S_CLK1 and the first data signal S_DATA1. The first clock signal S_CLK1 is embedded in the first data signal S_DATA1 with a different signal magnitude from the first data signal S_DATA1. Therefore, it is possible to extract the first clock signal S_CLK1 from the received signal S_R using the magnitude of the received signal S_R. In addition, the first data signal S_DATA1 can be extracted from the received signal S_R using the polarity of the received signal S_R. The received signal S_R is transmitted from a timing controller (not shown). The received signal S_R may be transmitted by single-ended signaling using one interconnection connecting the timing controller with the data driver circuit, or by differential signaling using two interconnections. The differential signaling method may be, for example, low-voltage differential signaling (LVDS).

The DLL 20 derives a second clock signal S_CLK2 from the first clock signal S_CLK1. There is a delay between the first and second clock signals S_CLK1 and S_CLK2 that changes according to a phase difference signal corresponding to a phase difference between them. However, a period in which the phase difference signal has a value corresponding to a case in which there is a phase difference is limited. More specifically, according to a conventional DLL, when a first clock signal is compromised during a period corresponding to some clocks, a phase difference signal corresponding to a case in which there is a phase difference is generated during the period. This causes the DLL to become unlocked and it takes a considerable amount of time to relock it. On the other hand, according to the DLL 20 of the present invention, the period in which the phase difference signal has the value corresponding to the case in which there is a phase difference is limited. Thus, the DLL 20 is not unlocked even if the first clock signal is compromised for a period corresponding to some clocks. For the purpose of limiting the period in which the phase difference signal has the value corresponding to the case in which there is a phase difference, for example, a phase detector may be reset such that the phase difference signal has a value corresponding to a case in which there is no phase difference using at least one delay signal obtained by delaying the first clock signal.

The data driver 30 samples the first data signal S_DATA1 according to the second clock signal S_CLK2, obtains the second data signal S_DATA2 by analog-converting the first data signal, and outputs the second data signal S_DATA2. The second data signal S_DATA2 is applied to a plurality of data lines (not shown) of a display panel (not shown). The second data signal S_DATA2 applies a gradation voltage or gradation current corresponding to the first data signal S_DATA1 to the data lines. The display panel may be, for example, a liquid crystal display (LCD) panel, a plasma display panel (PDP) or an organic electro-luminescence display (OELD) panel. A change of the second data signal S_DATA2 is controlled by a load signal TP. The load signal TP controls the data driver 30 to change the second data signal S_DATA2. The load signal TP is applied from, for example, the timing controller. The load signal TP may be transmitted through a separate interconnection as illustrated in FIG. 1, or through the same interconnection as the first clock signal S_CLK1 and the first data signal S_DATA1 unlike FIG. 1. The load signal TP may be extracted from, for example, the polarity of the first clock signal S_CLK1.

Figure 2:
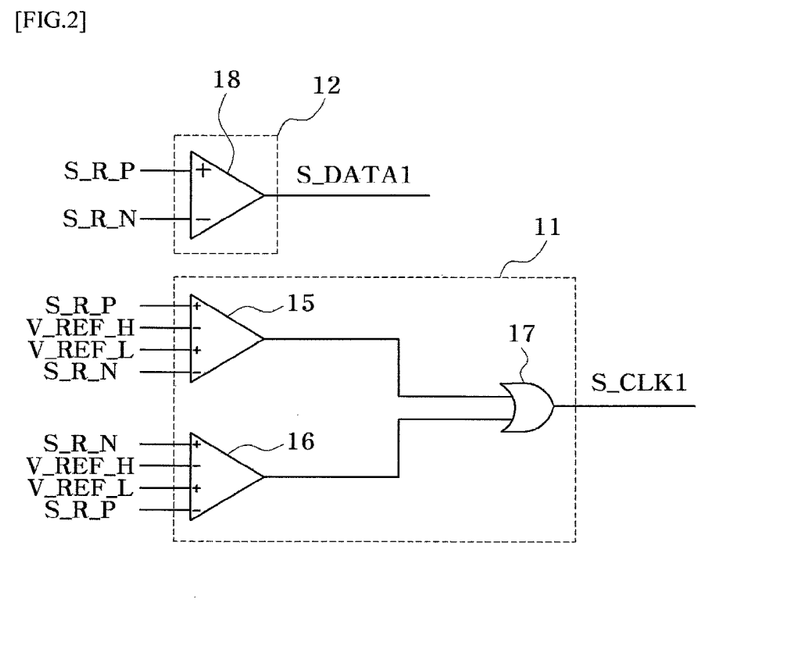
FIG. 2 illustrates an example of a multi-level detector employed in the data driver circuit of FIG. 1.
Figure 3:
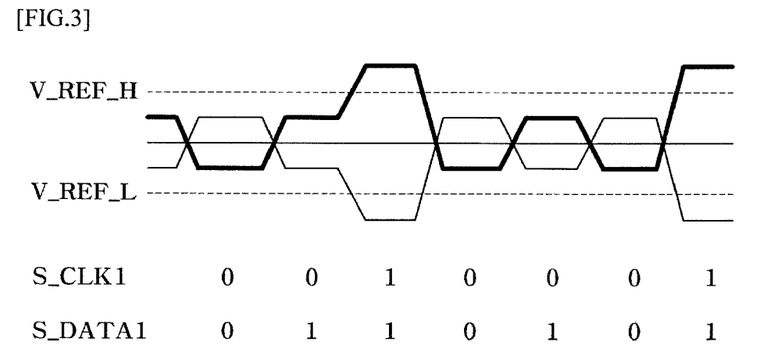
FIG. 3 is a timing diagram of received signals, reference voltages, a first clock signal and a first data signal.

FIG. 2 illustrates an example of the multi-level detector 10 employed in the data driver circuit of FIG. 1, showing a case in which the received signal S_R is transmitted by differential signaling. In this case, the received signal S_R is separated into a first signal S_R_P and a second signal S_R_N having opposite polarities. FIG. 3 is a timing diagram of the received signals S_R_P (bold line) and S_R_N (fine line), reference voltages V_REF_H and V_REF_L, the first clock signal S_CLK1 and the first data signal S_DATA1. Referring to FIGS. 2 and 3, the multi-level detector 10 includes a clock extractor 11 and a data extractor 12.

The clock extractor 11 compares the received signals S_R_P and S_R_N with the reference voltages V_REF_H and V_REF_L (V_REF_H is higher than V_REF_L) and generates the first clock signal S_CLK1 according to the result. To this end, the clock extractor 11 includes a first comparator 15, a second comparator 16 and an OR gate 17. When the first signal S_R_P is larger than the first reference voltage V_REF_H, and the second signal S_R_N is smaller than the second reference voltage V_REF_N, the first comparator 15 outputs a logic value of 1. Otherwise, the first comparator 15 outputs a logic value of 0. When the second signal S_R_N is larger than the first reference voltage V_REF_H, and the first the signal S_R_P is smaller than the second reference voltage V_REF_N, the second comparator 16 outputs a logic value of 1. Otherwise, the second comparator 16 outputs a logic value of 0. The OR gate 17 receives the outputs of the first and second comparators 15 and 16 and performs an OR operation.

The data extractor 12 including a comparator 18 compares the first and second signals S_R_P and S_R_N with each other and outputs the first data signal S_DATA1 having a logic value of 0 or 1 according to the result.

Figure 4:
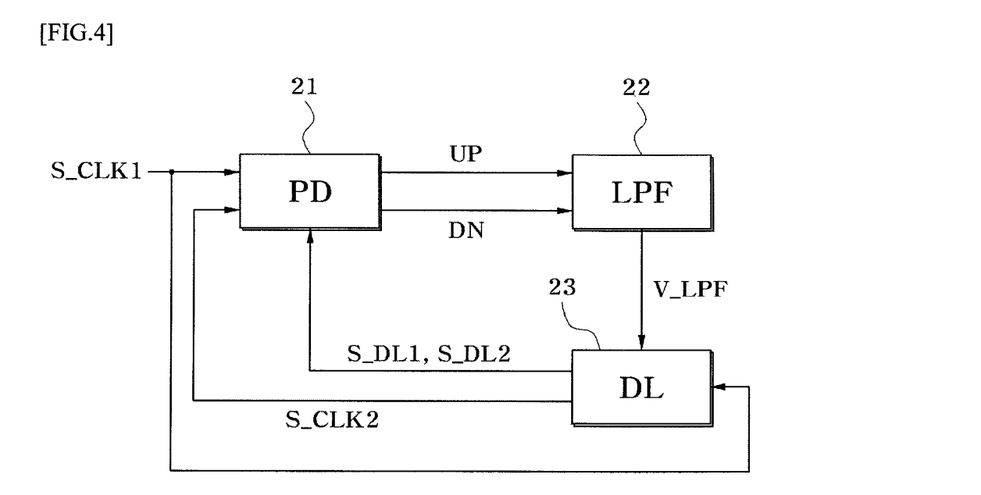
FIG. 4 illustrates an example of a delay-locked loop (DLL) employed in the data driver circuit of FIG. 1.
Figure 5:
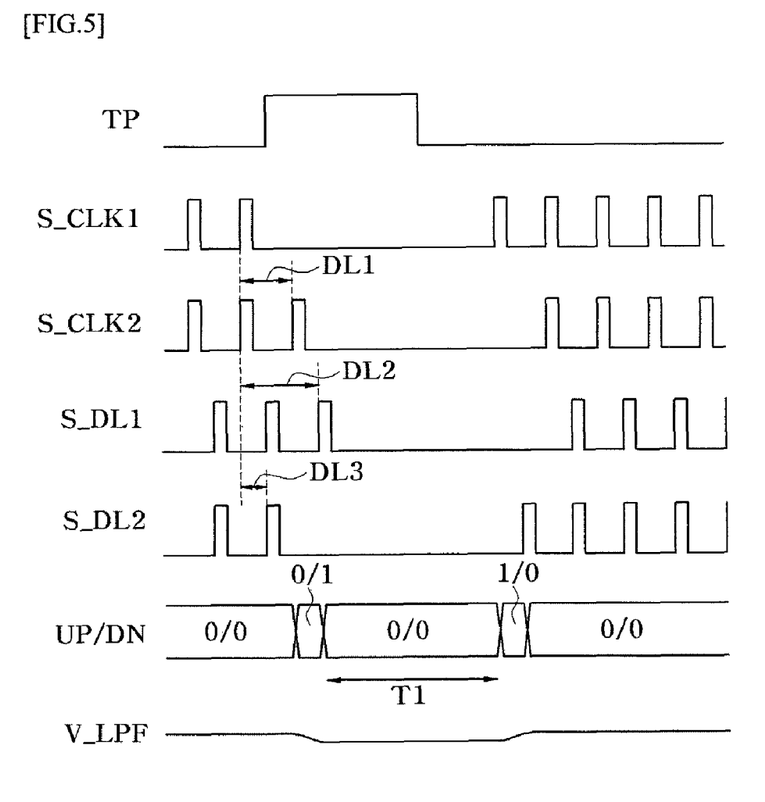
FIG. 5 is a timing diagram of a load signal, the first clock signal, a second clock signal, a first delay signal, a second delay signal, phase difference signals and a phase difference signal from which high-frequency components are removed.

FIG. 4 illustrates an example of the DLL 20 employed in the data driver circuit of FIG. 1, and FIG. 5 is a timing diagram of the load signal TP, the first clock signal S_CLK1, the second clock signal S_CLK2, a first delay signal S_DL1, a second delay signal S_DL2, phase difference signals UP and DN and a phase difference signal V_LPF from which high-frequency components are removed. Referring to FIGS. 4 and 5, the DLL 20 includes a phase detector 21, a low-pass filter (LPF) 22 and a delay line 23.

The phase detector 21 generates the phase difference signals UP and DN according to the first and second clock signals S_CLK1 and S_CLK2 and one or more delay signals. The phase difference may be output using the two signals UP and DN as shown in FIG. 4 and FIG. 5, or using one signal unlike the drawings. In the example shown in the drawings, a case in which the signals UP and DN are 0 and 1 respectively denotes that the first clock signal S_CLK1 is delayed relative to the second clock signal S_CLK2. A case in which the signals UP and DN are 1 and 0 respectively denotes that the first clock signal S_CLK1 leads the second clock signal S_CLK2. A case in which the signals UP and DN are 0 and 0 respectively denotes that the first clock signal S_CLK1 is the same as the second clock signal S_CLK2, that is, there is no phase difference between the first and second clock signals S_CLK1 and S_CLK2.

The first clock signal S_CLK1 is input from the outside of the DLL 20, and the second clock signal S_CLK2 is obtained by delaying the first clock signal S_CLK1. A delay from the first clock signal S_CLK1 to the second clock signal S_CLK2 is a first delay DL1. The one or more delay signals are obtained by delaying the first clock signal S_CLK1. The number of the delay signals may be two as shown in the drawings, or one, three or more unlike the drawings. When there are two delay signals S_DL1 and S_DL2, a second delay DL2 that is the delay of one of the two delay signals S_DL1 and S_DL2 may be larger than the first delay DL1, and a third delay DL3 that is a delay of the other of the two delay signals S_DL1 and S_DL2 may be smaller than the first delay DL1. When there is one delay signal S_DL1, the second delay DL2 that is the delay of the delay signal S_DL1 may be larger than the first delay DL1. When the second delay DL2 is larger than the first delay DL1, the delay signal S_DL1 can reduce, by a considerable time T1, a period in which the phase difference signals UP and DN have an undesired value corresponding to the case in which there is a phase difference.

The phase difference signals UP and DN have a value corresponding to a phase difference between the first and second clock signals S_CLK1 and S_CLK2 according to the first clock signal S_CLK1 or the second clock signal S_CLK2, and a value corresponding to a case in which there is no phase difference according to the delay signals S_DL [2:1]. The phase detector 21 shown in FIG. 4 outputs the phase difference signals UP and DN corresponding to the phase difference between the first and second clock signals S_CLK1 and S_CLK2 when it detects a rising edge of the first clock signal S_CLK1 or the second clock signal S_CLK2. In addition, the phase detector 21 shown in FIG. 4 outputs a signal indicating that there is no phase difference as the phase difference signals UP and DN when it receives the first delay signal S_DL1 or the second delay signal S_DL2 corresponding to "1".

The phase detector 21 may be designed to output the signal indicating that there is no phase difference as the phase difference signals UP and DN every time it receives the first delay signal S_DL1 or the second delay signal S_DL2 corresponding to "1". Otherwise, the phase detector 21 may be designed to only operate in this way for fine tuning and to output the phase difference signals UP and DN unaffected by the first and second delay signals S_DL1 and S_DL2 for coarse tuning. When the phase detector 21 is designed to operate in different ways according to fine tuning and coarse tuning, a lock time is reduced.

The LPF 22 functions to remove high-frequency components from the phase difference signals UP and DN. The LPF 22 shown in FIG. 4 outputs the phase difference signal V_LPF having a level corresponding to the phase difference signals UP and DN from which the high-frequency components are removed.

The delay line 23 derives the second clock signal S_CLK2 and the one or more delay signals S_DL1 and S_DL2 by delaying the first clock signal S_CLK1. The first delay DL1 that is the delay of the second clock signal S_CLK2 with respect to the first clock signal S_CLK1 is controlled by the phase difference signal V_LPF from which high-frequency components are removed. The delays of the one or more delay signals S_DL1 and S_DL2 with respect to the first clock signal S_CLK1 may be designed to be controlled by the phase difference signal V_LPF from which high-frequency components are removed, or not to be dependent on the phase difference signal V_LPF from which high-frequency components are removed.

Figure 6:
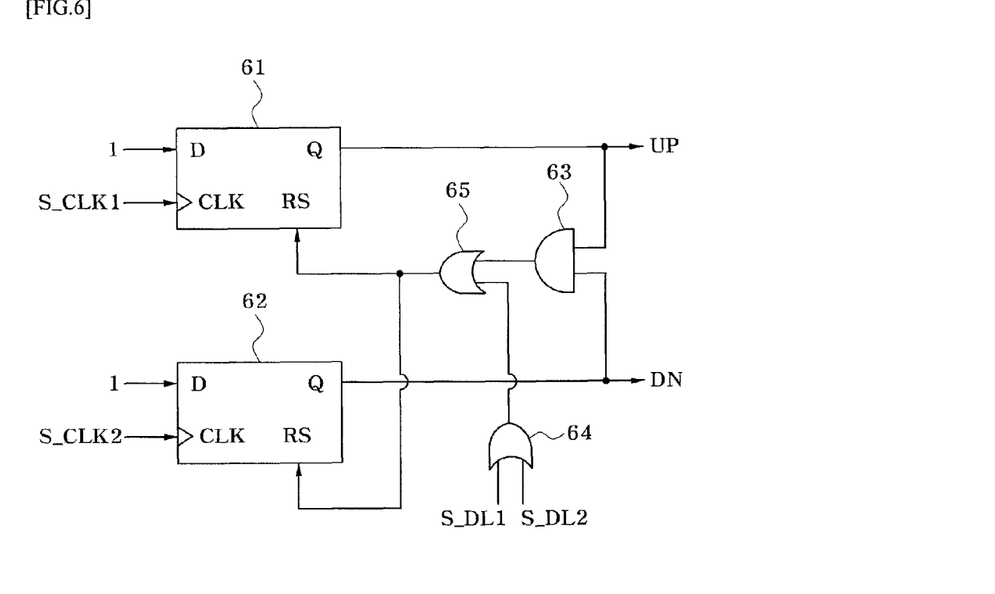
FIG. 6 illustrates an example of a phase detector employed in FIG. 4.

FIG. 6 illustrates an example of the phase detector 21 employed in FIG. 4. Referring to FIG. 6, the phase detector 21 includes a first D flip-flop 61, a second D flip-flop 62, an AND gate 63, a first OR gate 64 and a second OR gate 65.

The first D flip-flop 61 outputs a value of 1 when the first clock signal S_CLK1 applied to its clock terminal CLK rises, and a value of 0 when the output of the second OR gate 65 applied to its reset terminal RS becomes 1. The second D flip-flop 62 outputs a value of 1 when the second clock signal S_CLK2 applied to its clock terminal CLK rises, and a value of 0 when the output of the second OR gate 65 applied to its reset terminal RS becomes 1. The AND gate 63 performs an AND operation on the outputs of the first and second D flip-flops 61 and 62. The first OR gate 64 performs an OR operation on the delay signals S_DL1 and S_DL2, and the second OR gate 65 performs the OR operation on the output of the AND gate 63 and the output of the first OR gate 64.

The phase detector 21 illustrated in FIG. 6 is constituted as described above. Thus, every time the first or second delay signal S_DL1 or S_DL2 is applied, that is, activated, the phase detector 21 outputs the phase difference signals UP and DN of 0 and 0 regardless of a phase difference between the first and second clock signals S_CLK1 and S_CLK2. In addition, when a rising edge of the first or second delay signal S_DL1 or S_DL2 is received, the phase detector 21 outputs the phase difference signals UP and DN corresponding to a phase difference between the first and second clock signals S_CLK1 and S_CLK2.

FIG. 6 illustrates a case in which the phase detector 21 outputs the phase difference signals UP and DN as 0 and 0 every time the first or second delay signal S_DL1 or S_DL2 is applied. However, unlike FIG. 6, the phase detector 21 may be designed to only operate in this way for fine tuning and to output the phase difference signals UP and DN unaffected by the first and second delay signals S_DL1 and S_DL2, in other words, to operate such that the reset terminals RS of the D flip-flops 61 and 62 are affected by only the output of the AND gate 63, for coarse tuning. When the phase detector 21 is designed to operate in this way, a lock time is reduced.

Figure 7:
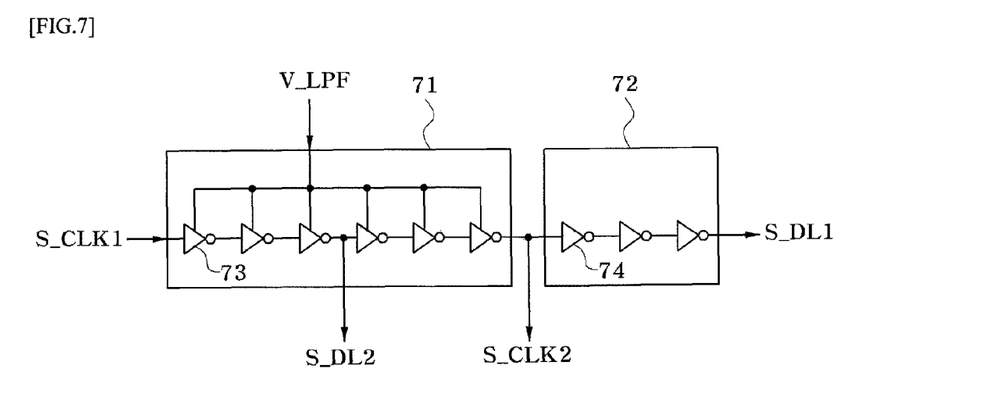
FIG. 7 illustrates an example of a delay line employed in FIG. 4.

FIG. 7 illustrates an example of the delay line 23 employed in FIG. 4. Referring to FIG. 7, the delay line 23 includes a first delay line 71 and a second delay line 72.

The first delay line 71 delays the first clock signal S_CLK1 and outputs the second clock signal S_CLK2, and delays the first clock signal S_CLK1 and outputs the second delay signal S_DL2. Since the third delay DL3, which is the delay of the second delay signal S_DL2, is smaller than the first delay DL1, which is the delay of the second clock signal S_CLK2, the second delay signal S_DL2 is output from the middle of the first delay line 71 as illustrated in FIG. 7. In other words, the third delay DL3 has a value larger than 0 and smaller than the first delay DL1. As shown in FIG. 7, the first delay line 71 may consist of a plurality of inverters 73. The delay of the respective inverters 73 is controlled by the phase difference signal V_LPF from which high-frequency components are removed.

The second delay line 72 delays the second clock signal S_CLK2 and outputs the first delay signal S_DL1. Here, the second clock signal S_CLK2 is obtained by delaying the first clock signal S_CLK1, and thus the first delay signal S_DL1 also is obtained by delaying the first clock signal S_CLK1. As illustrated in FIG. 7, the second delay line 72 may consist of a plurality of inverters 74. The delay of the respective inverters 74 may be independent of the phase difference signal V_LPF from which high-frequency components are removed as illustrated in FIG. 7, or may be controller by the phase difference signal V_LPF from which high-frequency components are removed unlike FIG. 7.

Figure 8:
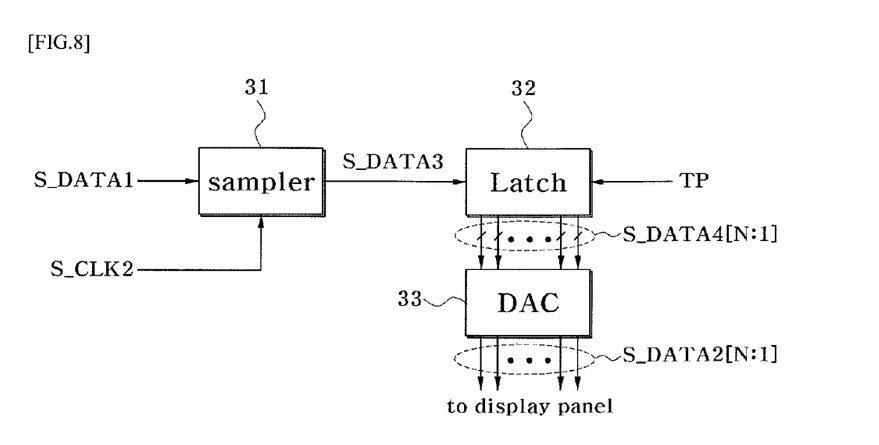
FIG. 8 illustrates an example of a data driver employed in the data driver circuit of FIG. 1.
Figure 9:
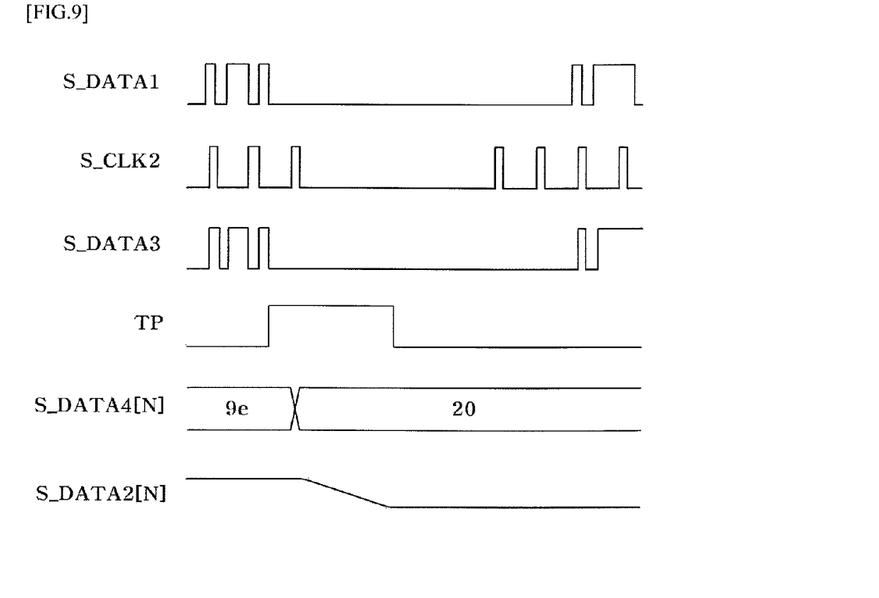
FIG. 9 is a timing diagram of first to fourth data signals, the second clock signal and the load signal.

FIG. 8 illustrates an example of the data driver 30 employed in the data driver circuit of FIG. 1, and FIG. 9 is a timing diagram of first to fourth data signals S_DATA1, S_DATA2, S_DATA3 and S_DATA4, the second clock signal S_CLK2 and the load signal TP. Referring to FIGS. 8 and 9, the data driver 30 includes a sampler 31, a latch 32 and a digital-to-analog converter (DAC) 33.

The sampler 31 samples the first data signal S_DATA1 according to the second clock signal S_CLK2. Since the first data signal S_DATA1 and the second clock signal S_CLK2 are synchronized with the first clock signal S_CLK1, it is possible to accurately sample the first data signal S_DATA1 according to the second clock signal S_CLK2. To sample the first data signal S_DATA1 using the second clock signal S_CLK2, the periods of the second clock signal S_CLK2 and the first data signal S_DATA1 do not have to be the same. In the drawings, a case in which the first data S_DATA1 of four bits is input during one period of the second clock signal S_CLK2 is illustrated. In this case, the sampler 31 may include a circuit capable of increasing the frequency of the second clock signal S_CLK2. In addition, the DLL 20 may transmit the second clock signal S_CLK2 and an additional second clock signal (not shown) having a phase difference with respect to the second clock signal S_CLK2 to the sampler 31, and the sampler 31 may perform sampling using them. As illustrated in FIG. 9, when the first data S_DATA1 of four bits is input during one period of the second clock signal S_CLK2, the additional second clock signal may include a clock signal obtained by shifting the second clock signal S_CLK2 by ¼ period, a clock signal obtained by shifting the second clock signal S_CLK2 by ²⁄₄ period, and a clock signal obtained by shifting the second clock signal S_CLK2 by ¾ period. The additional second clock signal may be output from the delay line 23.

The latch 32 stores the output S_DATA3 of the sampler 31 in sequence and then outputs it in parallel according to the load signal TP. For example, the output S_DATA4 of the latch 32 is separated into N signals each of eight bits. Here, N is the number of the data lines of the display panel. In FIG. 9, an N-th signal S_DATA4[N] of the fourth data signal S_DATA4 is expressed in hexadecimal notation.

The DAC 33 transmits the second data signal S_DATA2 obtained by analog-converting the output S_DATA4 of the latch 32 to the display panel (not shown). For example, the output S_DATA2 of the DAC 33 is separated into N signals. In FIG. 9, an N-th signal S_DATA2[N] of the second data signal S_DATA2 is illustrated.

The load signal TP does not have to be input to the latch 32 as illustrated in FIG. 8. For example, the load signal TP may be input to the DAC 33 instead of the latch 32. In this case, the DAC 33 may temporarily store the analog-converted second data signal S_DATA2 and then output the stored second data signal S_DATA2 to the display panel according to the load signal TP.

Figure 10:
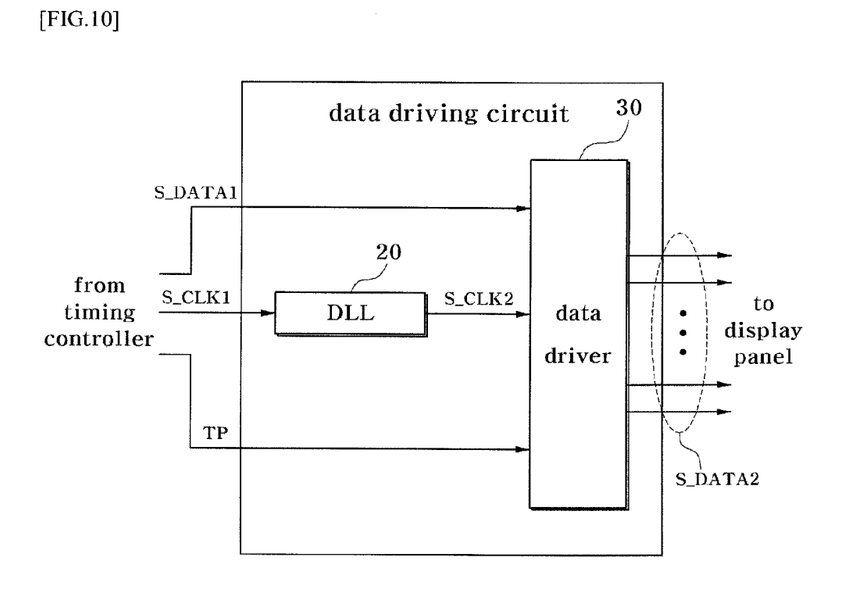
FIG. 10 is a block diagram of a data driver circuit according to a second example embodiment of the present invention, illustrating a case in which a first clock signal and a first data signal are received through different signal lines.

FIG. 10 is a block diagram of a data driver circuit according to a second example embodiment of the present invention, illustrating a case in which a first clock signal and a first data signal are received through different signal lines.

Referring to FIG. 10, the data driver circuit includes a DLL 20 and a data driver 30. The data driver circuit shown in FIG. 10 is almost the same as the data driver circuit shown in FIG. 1 except that it does not include the multi-level detector 10, and the first data signal S_DATA1 has several bits, e.g., 8 bits. Thus, a detailed description of the data driver circuit shown in FIG. 10 will be omitted.

A data driver circuit according to an example embodiment of the present invention can keep a DLL locked even if a part of a first clock signal transmitted from a timing controller is not restored due to a change of a second data signal output to a display panel. More specifically, a DLL included in the data driver circuit prevents a phase difference signal indicating that there is a phase difference from lasting too long, and thus it is possible to prevent the DLL from being unlocked. The first clock signal may be easily compromised when the first clock signal is embedded in a first data signal with a different signal magnitude. When the first clock signal is embedded at multi-levels like this, the data driver circuit according to an example embodiment of the present invention is useful.

In addition, a delay-locked loop according to an example embodiment of the present invention can be kept locked even if a part of an input first clock signal is compromised. More specifically, the delay-locked loop according to an example embodiment of the present invention resets a phase detector using at least one delay signal obtained by delaying the first clock signal (by letting the phase detector output a phase difference signal indicating that there is no phase difference), thereby preventing the phase detector from outputting a signal indicating that there is a phase difference for a long time. Therefore, it is possible to prevent the delay-locked loop according to an example embodiment of the present invention from being unlocked even if the first clock signal is compromised.

In addition, a data driver circuit and a delay-locked loop according to an example embodiment of the present invention can prevent a DLL from being unlocked.

While the invention has been shown and described with reference to certain example embodiments thereof, it will be understood by those skilled in the art that various changes in form and details may be made therein without departing from the spirit and scope of the invention as defined by the appended claims.

What is claimed is:

1. An apparatus comprising a delay-locked loop (DLL) configured to receive a first clock signal and output a second clock signal, wherein:
   the DLL comprises a phase detector configured to output a phase difference signal according to the first clock signal, the second clock signal and at least one delay signal;
   the phase difference signal has at least one of a value corresponding to a phase difference between the first clock signal and the second clock signal according to the first clock signal and the second clock signal and a value corresponding to no phase difference according to the at least one delay signal; and
   the DLL comprises a delay line configured to generate the second clock signal and the at least one delay signal by delaying the first clock signal according to the phase difference signal.

2. The apparatus of claim 1, wherein:
   said at least one delay signal comprises a first delay signal with a second delay;
   the second delay is longer than a first delay;
   the first delay is a delay of the second clock signal with respect to the first clock signal; and
   the second delay is a delay of the first delay signal.

3. The apparatus of claim 2, wherein the delay line comprises:
   a first delay line configured to generate the second clock signal by delaying the first clock signal; and
   a second delay line configured to generate the first delay signal by delaying the second clock signal.

4. The apparatus of claim 2, wherein:
said at least one delay signal comprises a second delay signal with a third delay;
the third delay is shorter than the first delay; and
the third delay is a delay of the second delay signal.

5. The apparatus of claim 1, wherein the second delay signal is output from the middle of the first delay line.

6. The apparatus of claim 4, wherein the phase difference signal has a value corresponding to the case in which there is no phase difference according to the first delay signal or the second delay signal.

7. The apparatus of claim 1, comprising a low-pass filter (LPF) connected between the phase detector and the delay line, wherein the LPF is configured to:
remove high-frequency components from the phase difference signal; and
transmit the phase difference signal to the delay line with the high frequency components removed.

8. An apparatus comprising: a delay-locked loop (DLL) configured to receive a first clock signal and output a second clock signal,
wherein the DLL comprises:
a delay line configured to receive the first clock signal and generate the second clock signal, a first delay signal, and a second delay signal by delaying the first clock signal; and
a phase detector configured to receive the first clock signal, the second clock signal, and the first and second delay signals and output an UP phase difference signal and a DN phase difference signal,
wherein the phase detector outputs the UP and DN phase difference signals indicating no phase difference regardless of a phase difference between the first and second clock signals when at least one of the received first and second delay signals is activated, and
wherein the phase detector outputs the UP and DN phase difference signals indicating a phase difference between the first and second clock signals when at least one of the received first and second delay signals has a rising edge.

9. The apparatus of claim 8, wherein the phase detector includes:
a first D flip-flop configured to receive the first clock signal through a first clock terminal and output the UP phase difference signal;
a second D flip-flop configured to receive the second clock signal through a second clock terminal and output the DN phase different signal;
an AND gate configured to receive the UP phase different signal from the first D flip-flop and the DN phase different signal from the second D flip-flop and output a result of AND operation of the UP and DN phase difference signals;
a second OR gate configured to receive the first and second delay signals from the delay line and output a result of OR operation of the first and second delay signals; and
a first OR gate configured to receive the output result of AND gate and the output result of the second OR gate and outputs a result of OR operation of the output results of AND gate and the second OR gate,
wherein the first D flip-flop receives the output result of the first OR gate and outputs the UP phase difference signal according to the first clock signal and the output result of the first OR gate, and the second D flip-flop receives the output result of the first OR gate and outputs the DN phase difference signal according to the second clock signal and the output result of the first OR gate.

10. The apparatus of claim 9, wherein the first D flip-flop outputs the UP phase difference signal having a value of 1 when the first clock signal applied to the first D flip-flop rises and outputs the UP phase difference signal having a value of 0 when the output result of the second OR gate applied to the first D flip-flop becomes 1, and the second D flip-flop outputs the DN phase difference signal having a value of 1 when the second clock signal applied to the second D flip-flop rises and outputs the DN phase difference signal having a value of 0 when the output result of the second OR gate applied to the second D flip-flop becomes 1.

11. The apparatus of claim 10, wherein the UP phase difference signal having the value of 0 and the DN phase difference signal having the value of 0 denote the no phase difference between the first and second clock signals.

12. The apparatus of claim 8, wherein in case of fine tuning, the phase detector outputs the UP and DN phase difference signals indicating no phase difference regardless of a phase difference based on the at least one of the activated first and second delay signals and in case of coarse tuning, the phase detector outputs the UP and DN phase difference signals indicating a phase difference unaffected by the first and second delay signals.

13. The apparatus of claim 8, wherein the delay line includes:
a first delay line configured to output the second clock signal by delaying the first clock signal and output the second delay signal with a third delay by delaying the first clock signal; and
a second delay line configured to output the first delay signal with a second delay by delaying the second clock signal,
wherein the third delay and the second delay is shorter than a first delay which is a delay of the second clock signal from the first clock signal.

14. An apparatus comprising: a delay-locked loop (DLL) configured to receive a first clock signal and output a second clock signal,
wherein the DLL comprises:
a delay line configured to receive the first clock signal and generate the second clock signal, a first delay signal, and a second delay signal by delaying the first clock signal; and
a phase detector configured to receive the first clock signal, the second clock signal, and the first and second delay signals and output an UP phase difference signal and a DN phase difference signal,
wherein the phase detector outputs the UP and DN phase difference signals indicating no phase difference regardless of a phase difference between the first and second clock signals when at least one of the received first and second delay signals is activated, and
wherein the phase detector outputs the UP and DN phase difference signals indicating a phase difference between the first and second clock signals when at least one of the received first and second delay signals has a rising edge,
wherein the phase detector includes:
a first D flip-flop configured to receive the first clock signal through a first clock terminal and output the UP phase difference signal;
a second D flip-flop configured to receive the second clock signal through a second clock terminal and output the DN phase different signal;
an AND gate configured to receive the UP phase different signal from the first D flip-flop and the DN phase different signal from the second D flip-flop and output a result of AND operation of the UP and DN phase difference signals;

a second OR gate configured to receive the first and second delay signals from the delay line and output a result of OR operation of the first and second delay signals; and a first OR gate configured to receive the output result of AND gate and the output result of the second OR gate and outputs a result of OR operation of the output results of AND gate and the second OR gate, wherein the first D flip-flop receives the output result of the first OR gate and outputs the UP phase difference signal according to the first clock signal and the output result of the first OR gate, and the second D flip-flop receives the output result of the first OR gate and outputs the DN phase difference signal according to the second clock signal and the output result of the first OR gate.

* * * * *